(12) United States Patent
Tanaka et al.

(10) Patent No.: US 11,367,844 B2
(45) Date of Patent: Jun. 21, 2022

(54) OLED PANEL PRODUCTION METHOD AND OLED PANEL PRODUCTION APPARATUS

(71) Applicant: Sharp Kabushiki Kaisha, Sakai (JP)

(72) Inventors: Tetsunori Tanaka, Sakai (JP); Shoji Okazaki, Sakai (JP); Yuki Yasuda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 333 days.

(21) Appl. No.: 16/478,936

(22) PCT Filed: Jan. 25, 2017

(86) PCT No.: PCT/JP2017/002594
§ 371 (c)(1),
(2) Date: Jul. 18, 2019

(87) PCT Pub. No.: WO2018/138812
PCT Pub. Date: Aug. 2, 2018

(65) Prior Publication Data
US 2021/0288274 A1  Sep. 16, 2021

(51) Int. Cl.
*H01L 51/00* (2006.01)
*H01L 27/32* (2006.01)
*B32B 37/18* (2006.01)
*B32B 38/10* (2006.01)
*C23C 16/30* (2006.01)
(Continued)

(52) U.S. Cl.
CPC ........ *H01L 51/0097* (2013.01); *B32B 37/182* (2013.01); *B32B 38/10* (2013.01); *C23C 16/308* (2013.01); *C23C 16/345* (2013.01); *C23C 16/401* (2013.01); *H01L 27/3244* (2013.01); *H01L 51/003* (2013.01); *H01L 51/56* (2013.01); *B32B 2255/10* (2013.01); *B32B 2255/20* (2013.01); *B32B 2457/206* (2013.01); *H01L 2251/5338* (2013.01)

(58) Field of Classification Search
CPC ............ H01L 51/0097; H01L 27/3244; H01L 51/003; H01L 51/56; B32B 37/182; C23C 16/308
USPC ....................... 257/40; 438/82, 99
See application file for complete search history.

(56) References Cited

U.S. PATENT DOCUMENTS

2008/0274268 A1  11/2008 Ogino
2014/0145587 A1  5/2014 Yoon
(Continued)

FOREIGN PATENT DOCUMENTS

JP  2008-270172 A  11/2008
JP  2011-199192 A  10/2011
(Continued)

OTHER PUBLICATIONS

Official Communication issued in International Patent Application No. PCT/JP2017/002594, dated Mar. 28, 2017.

*Primary Examiner* — Thinh T Nguyen
(74) *Attorney, Agent, or Firm* — Keating & Bennett, LLP

(57) ABSTRACT

Included are the steps of: forming a laminated body (7) by disposing a resin layer (12), an inorganic layer (3) having mean stress (Px) of 0 (zero) or having tensile stress, a TFT layer (4), an OLED element layer (5), and a sealing layer (6) in this order on an upper side of a supporting substrate (50); and separating the supporting substrate (50) from the laminated body (7).

19 Claims, 8 Drawing Sheets

(51) Int. Cl.
*C23C 16/34* (2006.01)
*C23C 16/40* (2006.01)
*H01L 51/56* (2006.01)

(56) References Cited

U.S. PATENT DOCUMENTS

2015/0207098 A1* 6/2015 Yasuda ............... H01L 51/5246
257/40
2018/0198096 A1 7/2018 Yasuda et al.

FOREIGN PATENT DOCUMENTS

| | | |
|---|---|---|
| JP | 2015-194642 A | 11/2015 |
| JP | 2016-038556 A | 3/2016 |
| WO | 2017/002372 A1 | 1/2017 |

* cited by examiner (a)

(b)

(c)

(d)

OLED PANEL PRODUCTION METHOD AND OLED PANEL PRODUCTION APPARATUS

TECHNICAL FIELD

The present invention relates to an OLED panel producing method.

BACKGROUND ART

A flexible OLED (organic light emitting diode) panel is produced by, for example, (i) forming a laminated body, made up of a plastic layer, an undercoat layer, a TFT layer, a light emitting element layer, a sealing layer, a cover substrate, and the like, on an upper side of a supporting substrate such as a glass substrate and then (ii) removing the supporting substrate by irradiating the laminated body with laser light or the like from a lower-surface side of the glass substrate (see Patent Literature 1).

CITATION LIST

Patent Literature

[Patent Literature 1]
Japanese Patent Application Publication Tokukai No. 2015-194642 (Publication date: Nov. 5, 2015)

SUMMARY OF INVENTION

Technical Problem

Generally, compressive stress occurs in the undercoat layer and the TFT layer. Thus, in a case where the supporting substrate is removed (that is, the compressive stress is released), the undercoat layer and the TFT layer elongate, so that the laminated body has a warp (curl) and/or a wrinkle. Disadvantageously, this adversely affects a subsequent step (s).

Solution to Problem

Steps carried out are the steps of: forming a laminated body by disposing a resin layer, an inorganic layer having mean stress of 0 (zero) or having tensile stress, a TFT layer, an OLED element layer, and a sealing layer in this order on an upper side of a supporting substrate; and separating the supporting substrate from the laminated body.

Advantageous Effects of Invention

By forming an inorganic layer having mean stress of 0 (zero) or having tensile stress, it is possible to bring mean stress of a laminated body closer to 0 (zero). This makes it possible to suppress a warp and/or a wrinkle each of which is caused in a case where the laminated body is separated from a supporting substrate.

DESCRIPTION OF EMBODIMENTS

The following description will discuss embodiments of the present invention with reference to FIGS. 1 through 6. Note, however, that those embodiments are only illustrative.

Figure 1:
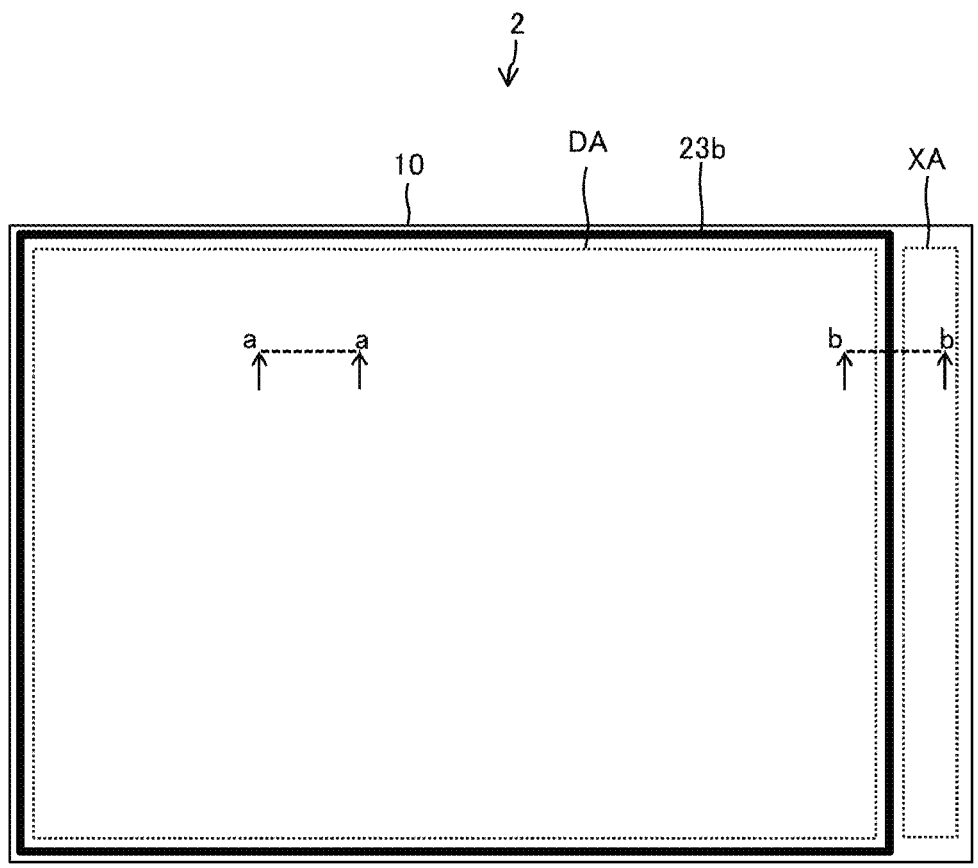
FIG. 1 is a plan view of an OLED panel in accordance with an embodiment.
Figure 2:
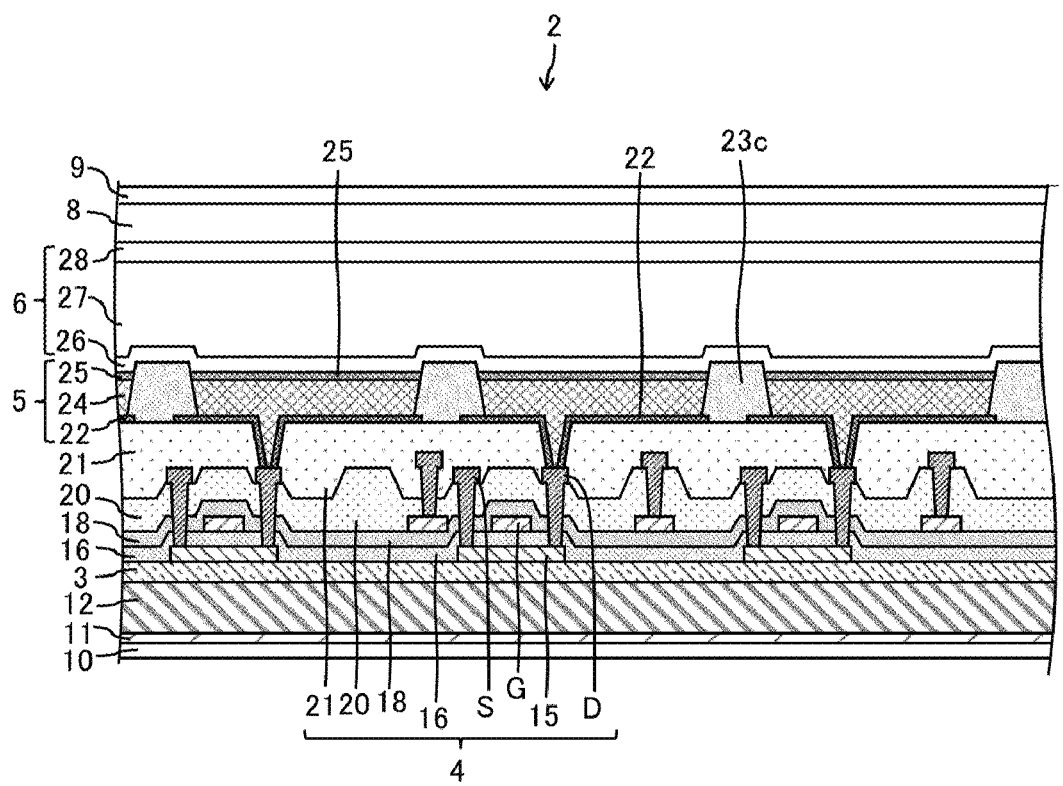
FIG. 2 is a cross-sectional view taken along a line a-a illustrated in FIG. 1.
Figure 3:
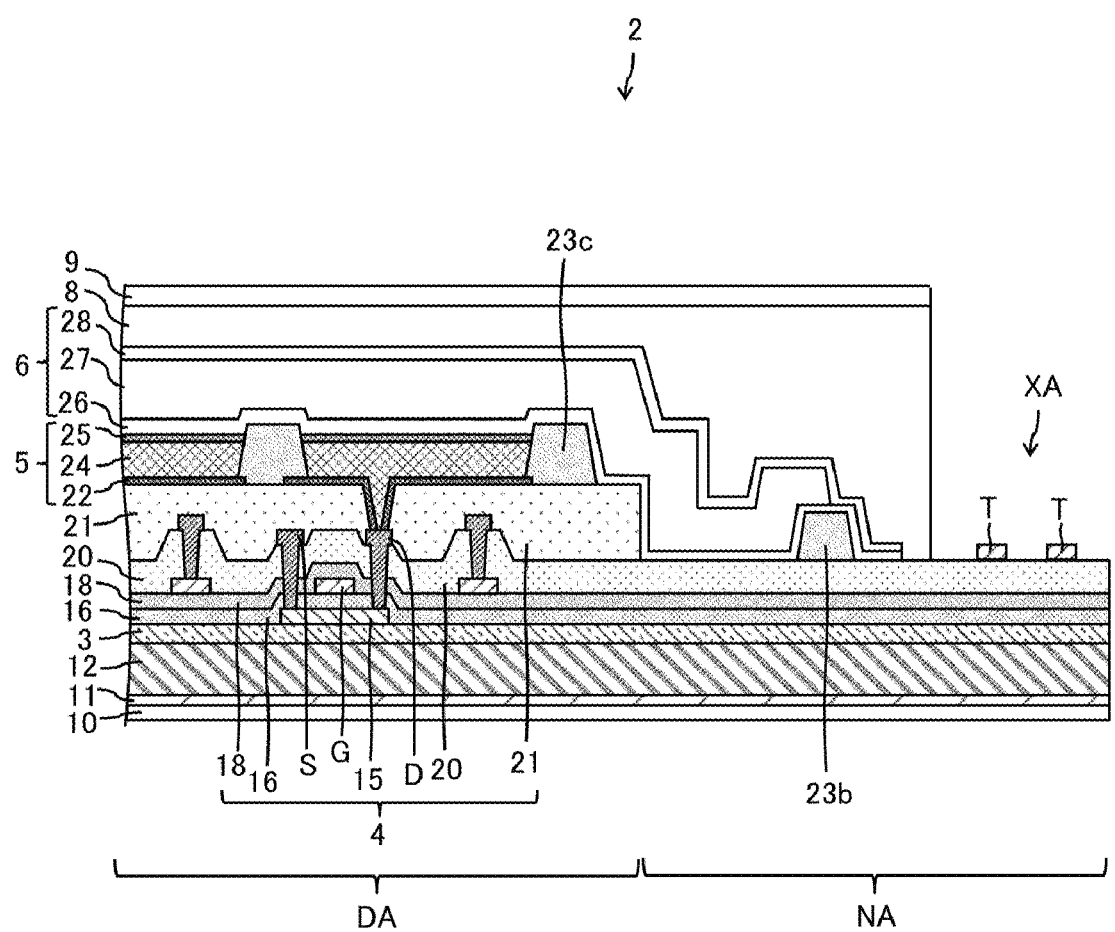
FIG. 3 is a cross-sectional view taken along a line b-b illustrated in FIG. 1.

FIG. 1 is a plan view of an OLED panel in accordance with an embodiment. FIG. 2 is a cross-sectional view taken along a line a-a illustrated in FIG. 1. FIG. 3 is a cross-sectional view taken along a line b-b illustrated in FIG. 1.

As illustrated in FIGS. 1 through 3, an OLED panel 2 includes: a bottom film 10; an adhesive layer 11 a resin layer 12; an inorganic layer 3 formed on an upper side of the resin layer 12; a semiconductor film 15 formed on an upper side of the inorganic layer 3; a gate insulating film 16 formed on an upper side of the semiconductor film 15; a gate electrode G formed on an upper side of the gate insulating film 16; a first interlayer insulating film 18 formed on an upper side of the gate electrode G; a second interlayer insulating film 20 formed on an upper side of the first interlayer insulating film 18; a source electrode S, a drain electrode D, and a terminal T each formed on an upper side of the second interlayer insulating film 20; a planarizing film 21 formed on an upper side of the source electrode S and the drain electrode D; an anode 22 formed on an upper side of the planarizing film 21; a partition wall 23c defining sub-pixels in a display region DA; a bank 23b formed in a non-display region NA; an organic EL (organic electroluminescence) layer 24 formed on an upper side of the anode 22; a cathode 25 formed on an upper side of the organic EL layer 24; a first sealing film 26 covering the partition wall 23c and the cathode 25; a second sealing film 27 covering the first sealing film 26; a third sealing film 28 covering the second sealing film 27; an adhesive layer 8; and a top film 9. The OLED panel 2 has flexibility.

In a terminal part XA of a non-display region NA, an OLED element layer 5 and a sealing layer 6 are not formed, but the terminal T for external connection is formed on a top surface of a TFT layer 4.

The bottom film 10 is made of, for example, an insulating flexible material. The resin layer 12 is made of, for example, polyimide. The inorganic layer 3, having a moisture-proof characteristic, is made up of a plurality of insulating inorganic films including a barrier film (moisture-proof film) and a stress adjusting film (later described).

The semiconductor film 15 is made of, for example, low-temperature polysilicon (LPTS) or oxide semiconductor. The gate insulating film 16 is made of, for example, silicon oxide (SiOx) or silicon nitride (SiNx) or is alternatively constituted by a multi-layer film made up of a layer of silicon oxide (SiOx) and a layer of silicon nitride (SiNx). Each of the gate electrode G, the source electrode S, the drain electrode D, and the terminal T is constituted by, for example, a single-layer film made of a metal such as aluminum (Al), tungsten (W), molybdenum (Mo), tantalum (Ta), chrome (Cr), titanium (Ti), or copper (Cu) or is alternatively constituted by a multi-layer film made up of layers of any of those metals. Note that FIG. 2 and the other drawings illustrate a thin film transistor (TFT), having the semiconductor film 15 as a channel, as having a top-gate structure. However, the TFT can alternatively have a bottom-gate structure (for example, in a case where the channel of the TFT is an oxide semiconductor).

Each of the first interlayer insulating film 18 and the second interlayer insulating film 20 can be made of, for example, silicon oxide (SiOx) or silicon nitride (SiNx). The planarizing film 21 can be made of a photosensitive organic material which can be applied, such as polyimide or acrylic. The anode 22 is made up of, for example, a layer of indium tin oxide (ITO) and a layer of an Ag-containing alloy. The anode 22 has light reflectivity.

The semiconductor film 15, the gate insulating film 16, the gate electrode G, the first interlayer insulating film 18, the second interlayer insulating film 20, the source electrode S, and the drain electrode D are included in the TFT layer 4.

The partition wall 23c and the bank 23b can be formed by, for example, an identical step with use of a photosensitive organic material which can be applied, such as polyimide or acrylic. The planarizing film 21 and partition wall 23c are formed in the display region DA (not in the non-display region NA). The bank 23b in the non-display region NA is formed on the second interlayer insulating film 20. The bank 23b defines an edge of the second sealing film 27.

The organic EL layer 24 is formed, by a deposition method or an ink jet method, in a region (sub-pixel region) surrounded by the partition wall 23c. The organic EL layer 24 is made up of, for example, a hole injection layer, a hole transfer layer, a light emission layer, an electron transfer layer, and an electron injection layer which are disposed in order from the bottom. The cathode 25 can be made of a transparent metal such as indium tin oxide (ITO) or indium zincum oxide (IZO).

The OLED (organic light emitting diode) element layer 5 is made up of the anode 22, the cathode 25, and the organic EL layer 24 sandwiched between the anode 22 and the cathode 25. In the OLED element layer 5, a driving electric current between the anode 22 and the cathode 25 causes a hole and an electron to recombine with each other in the light emission layer. By a resultant exciton reaching a ground state, light is emitted. The light thus emitted exits toward an upper side of the OLED panel 2.

Each of the first sealing film 26 and the third sealing film 28 can be made of, for example, silicon oxide (SiOx) or silicon nitride (SiNx). The second sealing film 27 is light-transmitting organic insulating film, and is thicker than each of the first sealing film 26 and the third sealing film 28. The second sealing film 27 can be made of a photosensitive organic material which can be applied, such as polyimide or acrylic. The sealing layer 6 is made up of the first sealing film 26, the second sealing film 27, and the third sealing film 28 which are disposed in order from an OLED-element-layer-5 side. The sealing layer 6 prevents permeation of a foreign matter, such as water and oxygen, into the OLED element layer 5 by covering the OLED element layer 5.

The top film 9 is made of, for example, a light-transmitting flexible material.

Figure 4:
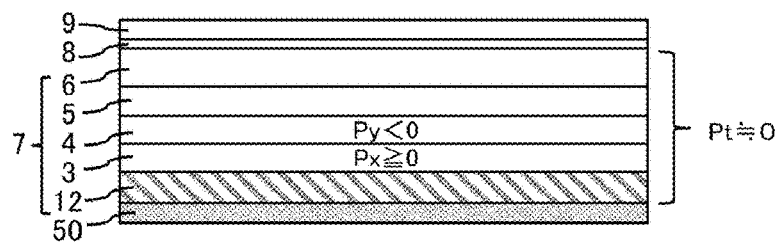
FIG. 4 is a schematic view illustrating an OLED panel producing method.
Figure 4:
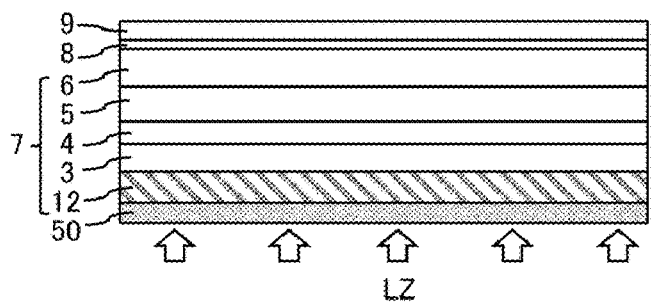
Figure 4:
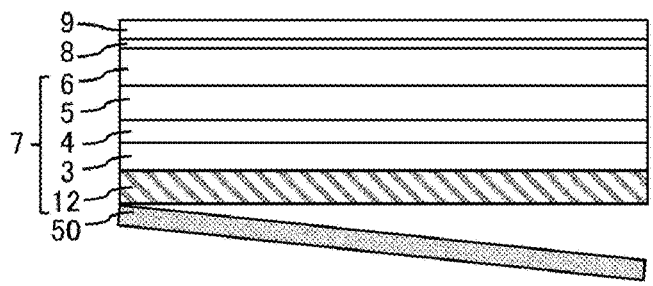
Figure 4:
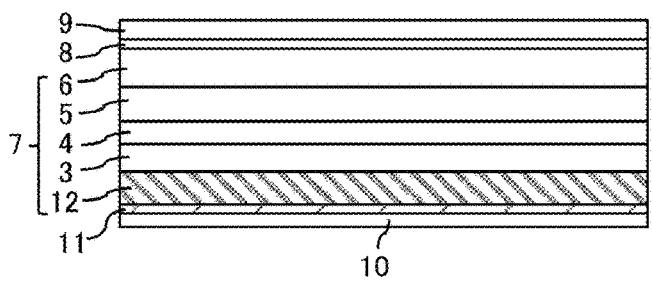

(a) through (d) of FIG. 4 are schematic views illustrating steps for producing the OLED panel 2. First, as illustrated in (a) of FIG. 4, the laminated body 7 having flexibility is formed by disposing the resin layer 12, the inorganic layer 3 having a moisture-proof characteristic, the TFT layer 4, the OLED element layer 5, and the sealing layer 6 in this order on an upper side of a glass substrate (supporting substrate) 50. Then, the top film 9 having flexibility is bonded onto the sealing layer 6 via the adhesive layer 8.

Here, mean stress Px of the inorganic layer 3 is 0 (zero) or has a positive value (tensile stress), while mean stress Py of the TFT layer 4 has a negative value (compressive stress). Next, as illustrated in (b) of FIG. 4, a lower surface of the glass substrate 50 is irradiated with laser light LZ. This causes the glass substrate 50 to be separated (removed) from the laminated body 7, as illustrated in (c) of FIG. 4. Next, as illustrated in (d) of FIG. 4, the bottom film 10 having flexibility is bonded to a lower surface of the laminated body 7 (a lower surface of the resin layer 12) via the adhesive layer 11. The steps illustrated in (a) through (d) of FIG. 4 are carried out by an OLED panel producing device.

In a case where a film is formed on a substrate by a CVD method or the like, stress (force per unit area) occurs, in the film, in a direction normal to a cross section of the film which cross section extends in a thickness direction. This stress includes (i) compressive stress (unit: pascal), which is a force resistant to an external force acting in a direction in which the film is shortened, and (ii) tensile stress (unit: pascal), which is a force resistant to an external force acting in a direction in which the film is pulled. The compressive stress is indicated by a negative value, and the tensile stress is indicated by a positive value.

The film having the compressive stress elongates, in a case where the external force disappears (the compressive stress is released). The film having the tensile stress shortens, in a case where the external force disappears (the tensile stress is released). Stress occurring during formation of the film is determined depending on a substance from which the film is formed, a condition under which the film is formed, a base material on which the film is formed, and the like.

EMBODIMENT 1

Figure 5:
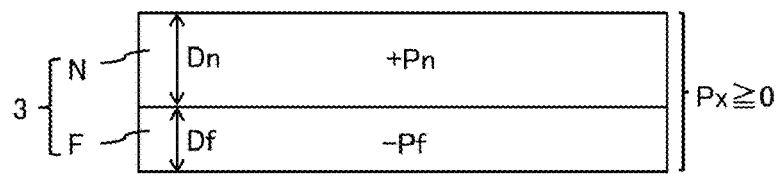
FIG. 5 is a schematic view illustrating an example of formation of an inorganic layer.
Figure 5:
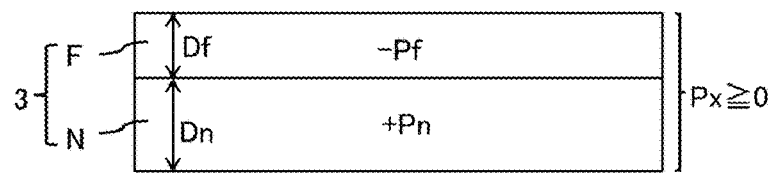
Figure 5:
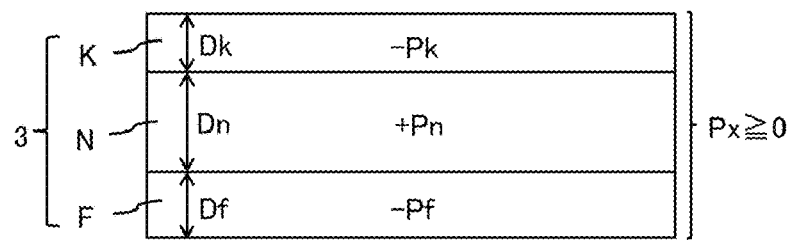
Figure 5:
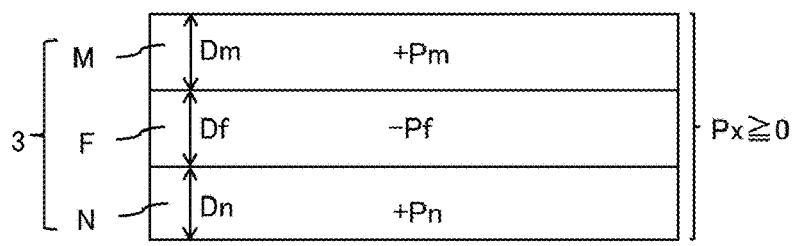

FIG. 5 is a schematic view illustrating an example of formation of an inorganic layer. An inorganic layer 3 as illustrated in (a) of FIG. 4 is made up of (i) an inorganic film F which is located on a lower side (resin-layer side) and which has a thickness of Df and stress of −Pf (compressive stress) and (ii) an inorganic film N which is located on an upper side (TFT-layer side) and which has a thickness of Dn and stress of +Pn (tensile stress), for example, as illustrated in (a) of FIG. 5. Mean stress Px of the inorganic layer 3 is caused to be as follows: Mean stress Px=(−Pf×Df+Pn×Dn)/(Df+Dn)≥0.

The inorganic film F can be made of, for example, silicon nitride (SiNx) or silicon oxide (SiOx). The inorganic film N can be made of, for example, silicon oxynitride (SiNxOy). In this case, the inorganic film F functions as a moisture-proof (barrier) film, and the inorganic film N functions as a stress adjusting film.

The inorganic film F and the inorganic film N can be formed with use of, for example, a plasma CVD device. Specifically, the inorganic film F and the inorganic film N can be formed as follows. A glass substrate 50 on which a resin layer 12 is formed is placed in a vacuum chamber. A mixed gas of monosilane, ammonia, nitrogen, hydrogen, and the like is introduced into the vacuum chamber. Then, plasma discharge is carried out so that the inorganic film F (silicon nitride film) having a thickness of Df and stress of −Pf is formed. Next, the glass substrate 50 on which the resin layer 12 and the inorganic film F are formed is placed in the vacuum chamber. Into this vacuum chamber, a mixed gas of monosilane, ammonia, dinitrogen monoxide, nitrogen, hydrogen, and the like is introduced. Then, plasma discharge is carried out so that the inorganic film N (silicon oxynitride film) having a thickness of Dn and stress of +Pn is formed.

Here, Dn is set to be 3 to 4 times greater than Df. Further, each gas flow rate (monosilane flow rate, ammonia flow rate, nitrogen flow rate, hydrogen flow rate) for forming the inorganic film F and each gas flow rate (monosilane flow rate, ammonia flow rate, nitrogen flow rate, dinitrogen monoxide flow rate) for forming the inorganic film N are set so that Px≥0.

According to a conventional OLED panel producing method, in a case where a laminated body (undercoat layer, TFT layer, OLED element layer, and sealing layer) is formed, mean stress of the undercoat layer and mean stress of the TFT layer are each negative (compressive stress), and mean stress of the entire laminated body is also negative (compressive stress). Therefore, in a case where a glass substrate is removed (in a case where stress of each layer is released), the laminated body elongates relative to a top film. This causes a problem that a curl and/or a wrinkle occur(s) in the laminated body. However, by causing mean stress Px of the inorganic layer 3 to be equal to or greater than 0 (zero) as illustrated in (a) of FIG. 4 and (a) of FIG. 5, elongation of a laminated body 7 which elongation is caused in a case where the glass substrate 50 is removed is reduced, so that a curl and/or a wrinkle are/is less likely to occur in the laminated body 7. This facilitates handling of the laminated body 7 in a subsequent step(s). A configuration illustrated in (a) of FIG. 5 is suitable for a case where a bottom-gate type TFT, having an oxide semiconductor as a channel, is, for example, formed in a TFT layer 4.

The inorganic layer 3 as illustrated in (a) of FIG. 4 can be alternatively made up of (i) the inorganic film F which is located on the upper side and which has a thickness of Df and stress of −Pf (compressive stress) and (ii) the inorganic film N which is located on the lower side and which has a thickness of Dn and stress of +Pn (tensile stress), for example, as illustrated in (b) of FIG. 5. The mean stress Px of the inorganic layer 3 thus configured is caused to be as follows: Mean stress Px=(−Pf×Df+Pn×Dn)/(Df+Dn)≥0. Here, Dn is set to be 3 to 4 times greater than Df.

The inorganic layer 3 as illustrated in (a) of FIG. 4 can be alternatively made up of (i) the inorganic film F which has a thickness of Df and stress of −Pf (compressive stress), (ii) the inorganic film N which has a thickness of Dn and stress of +Pn (tensile stress), and (iii) an inorganic film K which has a thickness of Dk and stress of −Pk (compressive stress), the inorganic film F, the inorganic film N, and the inorganic film K being disposed in this order from the resin-layer side, for example, as illustrated in (c) of FIG. 5. The mean stress Px of the inorganic layer 3 thus configured is caused to be as follows: Mean stress Px=(−Pf×Df+Pn×Dn−Pk×Dk)/(Df+Dn+Dk)≥0. Here, Dn is set to be 4 to 6 times greater than each of Df and Dk. The inorganic film F is caused to function as a moisture-proof (barrier) film, the inorganic film N is caused to function as a stress adjusting film, and the inorganic film K is caused to function as a base coat film of a semiconductor. This configuration is suitable for a case where a top-gate type TFT, having LTPS as a channel, is, for example, formed in the TFT layer 4.

The inorganic layer 3 as illustrated in (a) of FIG. 4 can be alternatively made up of (i) the inorganic film N which has a thickness of Dn and stress of +Pn (tensile stress), (ii) the inorganic film F which has a thickness of Df and stress of −Pf (compressive stress), and (iii) an inorganic film M which has a thickness of Dm and stress of +Pm (compressive stress), the inorganic film N, the inorganic film F, and the inorganic film M being disposed in this order from the resin-layer side, for example, as illustrated in (d) of FIG. 5. The mean stress Px of the inorganic layer 3 thus configured is caused to be as follows: Mean stress Px=(+Pn×Dn−Pf×Df+Pm×Dm)/(Dn+Df+Dm))≥0. Here, the inorganic film F is caused to function as a moisture-proof (barrier) film, and the inorganic film N and the inorganic film M are each caused to function as a stress adjusting film. This configuration is suitable for a case where a bottom-gate type TFT, having an oxide semiconductor as a channel, is, for example, formed in the TFT layer 4.

Figure 6:
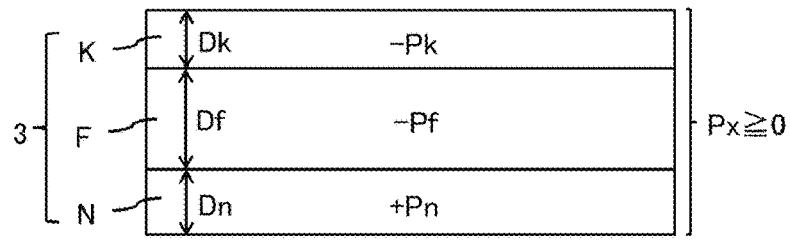
FIG. 6 is a schematic view illustrating a further example of the formation of the inorganic layer.
Figure 6:
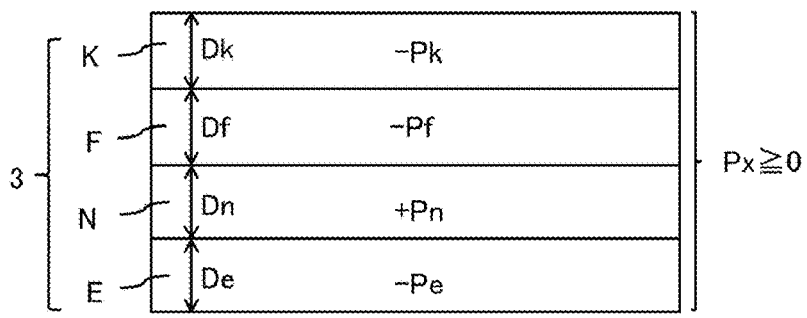
Figure 6:
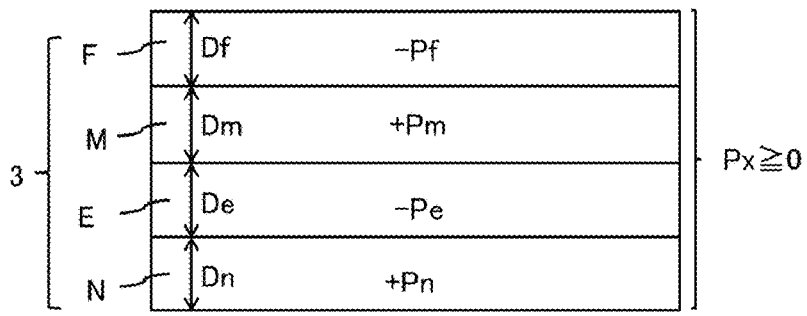
Figure 6:
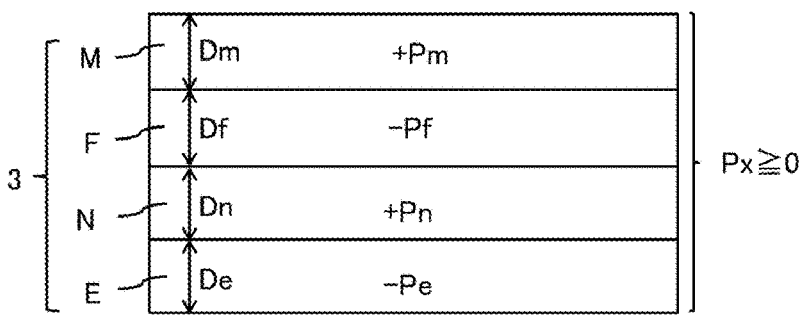

The inorganic layer 3 as illustrated in (a) of FIG. 4 can be alternatively made up of (i) the inorganic film N which has a thickness of Dn and stress of +Pn (tensile stress), (ii) the inorganic film F which has a thickness of Df and stress of −Pf (compressive stress), and (iii) the inorganic film K which has a thickness of Dk and stress of −Pk (compressive stress), the inorganic film N, the inorganic film F, and the inorganic film K being disposed in this order from the resin-layer side, for example, as illustrated in (a) of FIG. 6. The mean stress Px of the inorganic layer 3 thus configured is caused to be as follows: Mean stress Px=(+Pn×Dn−Pf×Df−Pk×Dk)/(Dn+Df+Dk)≥0. Here, Dn is set to be 4 to 6 times greater than each of Df and Dk. The inorganic film F is caused to function as a moisture-proof (barrier) film, the inorganic film N is caused to function as a stress adjusting film, and the inorganic film K is caused to function as a base coat film of a semiconductor. This configuration is suitable for a case where a top-gate type TFT, having LTPS as a channel, is, for example, formed in the TFT layer 4.

The inorganic layer 3 as illustrated in (a) of FIG. 4 can be alternatively made up of (i) an inorganic film E which has a thickness of De and stress of −Pe (compressive stress), (ii) the inorganic film N which has a thickness of Dn and stress of +Pn (tensile stress), (iii) the inorganic film F which has a thickness of Df and stress of −Pf (compressive stress), and (iv) the inorganic film K which has a thickness of Dk and stress of −Pk (compressive stress), the inorganic film E, the inorganic film N, the inorganic film F, and the inorganic film K being disposed in this order from the resin-layer side, for example, as illustrated in (b) of FIG. 6. The mean stress Px of the inorganic layer 3 thus configured is caused to be as follows: Mean stress Px=(−Pe×De+Pn×Dn−Pf×Df−Pk×Dk)/(De+Dn+Df+Dk)≥0. Here, Dn is set to be 8 to 12 times greater than each of Df and De. Each of the inorganic film E and the inorganic film F is caused to function as a moisture-proof (barrier) film, the inorganic film N is caused to function as a stress adjusting film, and the inorganic film K is caused to function as a base coat film of a semiconductor. By thus disposing two moisture-proof (barrier) films in respective different layers (on both sides of the stress adjusting film), it is possible to enhance a coverage characteristic against a foreign matter, and possible to improve moisture-proof performance. This configuration is suitable for a case where a top-gate type TFT, having LTPS as a channel, is, for example, formed in the TFT layer 4.

The inorganic layer 3 as illustrated in (a) of FIG. 4 can be alternatively made up of (i) the inorganic film N which has a thickness of Dn and stress of +Pn (tensile stress), (ii) the inorganic film E which has a thickness of De and stress of −Pe (compressive stress), (iii) the inorganic film M which has a thickness of Dm and stress of +Pm (compressive stress), and (iv) the inorganic film F which has a thickness of Df and stress of −Pf (compressive stress), the inorganic film N, the inorganic film E, the inorganic film M, and the inorganic film F being disposed in this order from the resin-layer side, for example, as illustrated in (c) of FIG. 6.

The mean stress Px of the inorganic layer 3 thus configured is caused to be as follows: Mean stress Px=(+Pn×Dn−Pe×De+Pm×Dm−Pf×Df)/(Dn+De+Dm+Df)≥0. Here, each of Dn and Dm is set to be 3 to 4 times greater than each of De and Df. Each of the inorganic film E and the inorganic film F is caused to function as a moisture-proof (barrier) film, and each of the inorganic film N and the inorganic film M is caused to function as a stress adjusting film. This configuration is suitable for a case where a bottom-gate type TFT, having an oxide semiconductor as a channel, is, for example, formed in the TFT layer 4.

The inorganic layer 3 as illustrated in (a) of FIG. 4 can be alternatively made up of (i) the inorganic film E which has a thickness of De and stress of −Pe (compressive stress), (ii) the inorganic film N which has a thickness of Dn and stress of +Pn (tensile stress), (iii) the inorganic film F which has a thickness of Df and stress of −Pf (compressive stress), and (iv) the inorganic film M which has a thickness of Dm and stress of +Pm (compressive stress), the inorganic film E, the inorganic film N, the inorganic film F, and the inorganic film M being disposed in this order from the resin-layer side, for example, as illustrated in (d) of FIG. 6. The mean stress Px of the inorganic layer 3 thus configured is caused to be as follows: Mean stress Px=(−Pe×De+Pn×Dn−Pf×Df+Pm×Dm)/(De+Dn+Df+Dm)≥0. Here, each of Dn and Dm is set to be 3 to 4 times greater than each of De and Df. Each of the inorganic film E and the inorganic film F is caused to function as a moisture-proof (barrier) film, and each of the inorganic film N and the inorganic film M is caused to function as a stress adjusting film. This configuration is suitable for a case where a bottom-gate type TFT, having an oxide semiconductor as a channel, is, for example, formed in the TFT layer 4.

Note that, in order to suppress, as much as possible, a curl which occurs in a case where the glass substrate 50 is removed, it is desirable that mean stress Pt of the entire laminated body 7 as illustrated in (a) of FIG. 4 be brought closer to 0 (zero). Specifically, in the laminated body 7 as illustrated in (a) of FIG. 4, it is desirable to cause mean stress of the resin layer 12 (for example, polyimide film) and the inorganic layer 3 to be 1.0 MPa to 2.0 MPa and to cause the mean stress Pt of the entire laminated body 7 to be −10 MPa to +10 MPa.

EMBODIMENT 2

Figure 7:
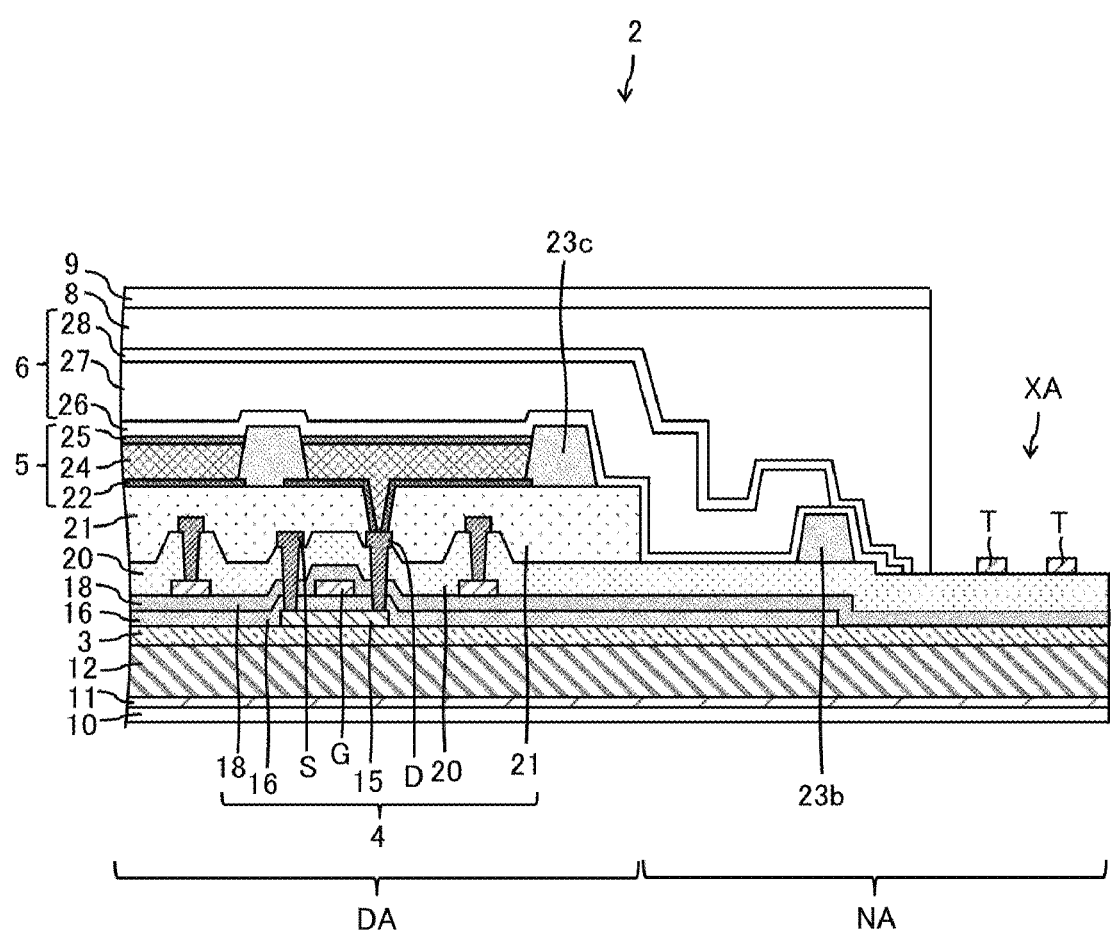
FIG. 7 is a schematic view illustrating an example of formation of a non-display region.

Note that mean stress of a non-display region NA (see FIG. 2), which differs from a display region DA in layer structure, inclines to be negative as compared with mean stress of the display region DA. Therefore, by hollowing out or thinning at least part of a gate insulating film 16 (compressive stress) in the non-display region NA as illustrated in FIG. 7, hollowing out or thinning at least part of a first interlayer insulating film 18 (compressive stress) in the non-display region NA, or hollowing out or thinning at least part of a second interlayer insulating film 20 (compressive stress) in the non-display region NA so that inclination of the mean stress of the non-display region NA to be negative is corrected, it is possible to prevent a curl which occurs in a case where a glass substrate 50 is removed.

Since, particularly in a terminal part XA of the non-display region NA, a second sealing film 27 (thick organic insulating film) in which tensile stress occurs is not formed, it is desirable to correct stress by altering a structure of an inorganic insulating film in a TFT layer 4 as described above.

Figure 8:
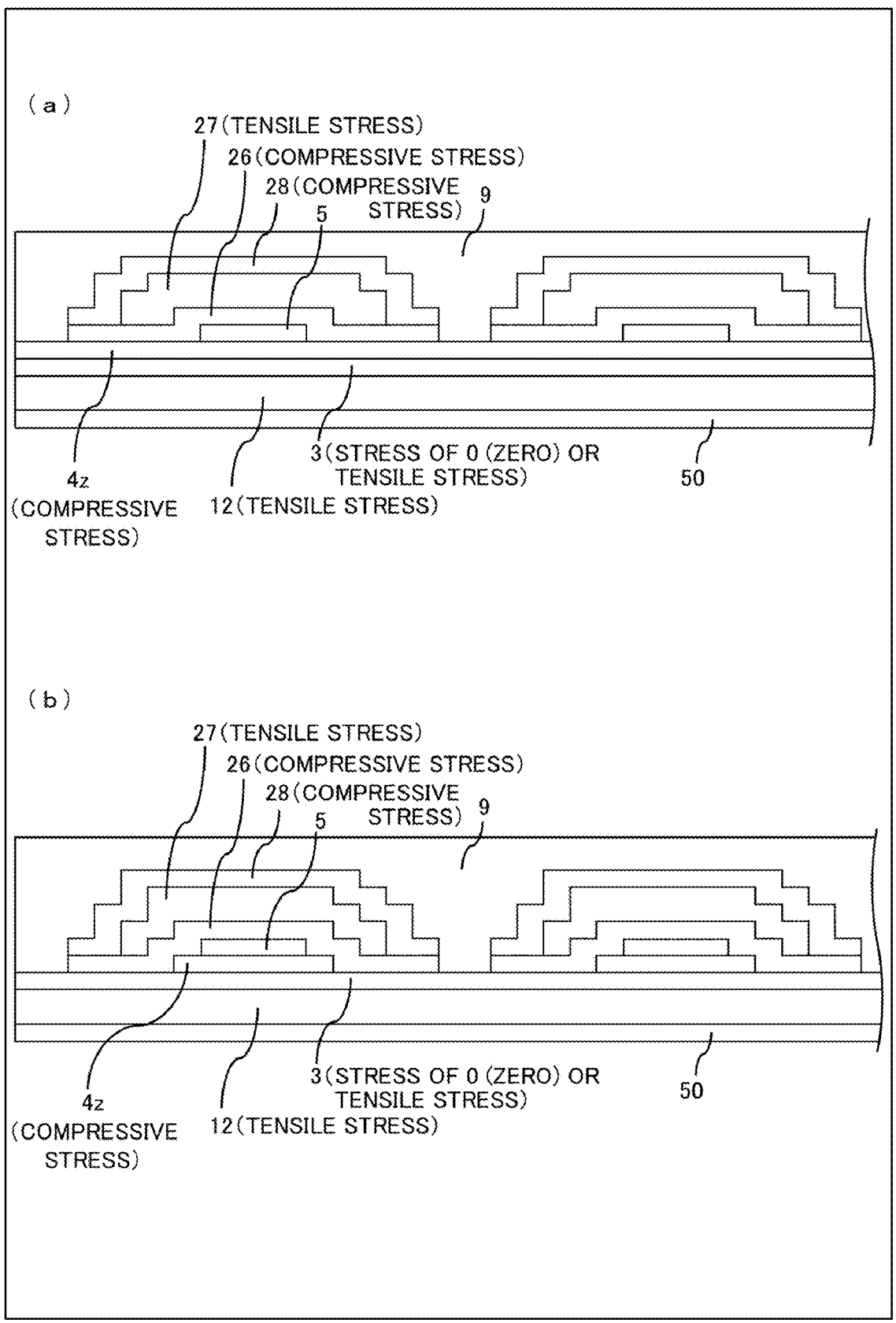
FIG. 8 is a cross-sectional view illustrating another step for producing an OLED panel.

(a) of FIG. 8 illustrates a case where a plurality of laminated bodies as illustrated in (a) of FIG. 4 are formed on an identical mother glass 50 (mean stress Px of an inorganic layer 3≥0). In a plan view, an edge of a third sealing film 28 is located on an inner side of an edge of an inorganic insulating film 4z in a TFT layer. In this respect, there is room for contrivance. That is, it is possible to correct mean stress of a non-display region (particularly, a peripheral part which does not overlap a second sealing film 27) so as to be positive, by, in each of the plurality of laminated bodies, causing the edge of the inorganic insulating film 4z (for example, at least one of a gate insulating film 16, a first interlayer insulating film 18, and a second interlayer insulating film 20 each having compressive stress) in the TFT layer to be located on an inner side of the edge of the third sealing film 28, as illustrated in (b) of FIG. 8.

Recap

An OLED panel producing method in accordance with Aspect 1 includes the steps of: forming a laminated body by disposing a resin layer, an inorganic layer having mean stress of 0 (zero) or having tensile stress, a TFT layer, an OLED element layer, and a sealing layer in this order on an upper side of a supporting substrate; and separating the supporting substrate from the laminated body.

According to Aspect 2, the inorganic layer includes a first inorganic film (for example, inorganic insulating film) having tensile stress and a second inorganic film (for example, inorganic insulating film) having compressive stress.

According to Aspect 3, the supporting substrate is removed after a top film having flexibility is bonded onto the sealing layer.

According to Aspect 4, the inorganic layer is formed so as to be in contact with the resin layer.

According to Aspect 5, a bottom film having flexibility is bonded to a lower side of the resin layer after the supporting substrate is separated.

According to Aspect 6, the second inorganic film is formed on an upper side of the first inorganic film.

According to Aspect 7, the first inorganic film is formed so as to be thicker than the second inorganic film.

According to Aspect 8, each of the first inorganic film and the second inorganic film is formed by a CVD method.

According to Aspect 9, the first inorganic film and the second inorganic film are made of respective different inorganic compounds.

According to Aspect 10, the first inorganic film is made of silicon oxynitride.

According to Aspect 11, the second inorganic film is made of silicon nitride or silicon oxide.

According to Aspect 12, the first inorganic film is caused to function as a stress adjusting film.

According to Aspect 13, the second inorganic film is caused to function as a barrier film.

According to Aspect 14, the inorganic layer includes a third inorganic film (for example, inorganic insulating film) which functions as a base coat film of a semiconductor of the TFT layer.

According to Aspect 15, in a plan view, an edge of at least one inorganic film (for example, inorganic insulating film) included in the TFT layer is caused to be located on an inner side of an edge of an inorganic film (for example, inorganic insulating film) included in the sealing layer.

According to Aspect 16, a terminal part is formed which includes the resin layer, the inorganic layer, and the TFT layer but does not include the OLED element layer and the sealing layer.

According to Aspect 17, the supporting substrate is separated by irradiating a lower surface of the supporting substrate, which is a light-transmitting substrate, with laser light.

According to Aspect 18, an absolute value of mean stress of the laminated body is not more than 10.0 Mpa before the supporting substrate is separated.

According to Aspect 19, the first inorganic film, the second inorganic film, and the third inorganic film are formed in order from a resin-layer side.

An OLED panel producing device in accordance with Aspect 20 carries out the steps of: forming a laminated body by disposing a resin layer, an inorganic layer having mean stress of 0 (zero) or having tensile stress, a TFT layer, an OLED element layer, and a sealing layer in this order on an upper side of a supporting substrate; and separating the supporting substrate from the laminated body.

Note that the present invention is not limited to the foregoing embodiments, and the present invention also encompasses, in its technical scope, any embodiment derived by combining technical means disclosed in differing embodiments. Further, it is possible to form a new technical feature by combining technical means disclosed in differing embodiments.

REFERENCE SIGNS LIST

2 OLED panel
3 Inorganic layer
4 TFT layer
5 OLED element layer
6 Sealing layer
7 Laminated body
9 Top film
10 Bottom film
23b Bank
26 First sealing film
27 Second sealing film
28 Third sealing film
50 Glass substrate
XA Terminal part
DA Display region
NA Non-display region
Px Mean stress of inorganic layer
Py Mean stress of TFT layer
Pt Mean stress of laminated body

The invention claimed is:

1. An OLED panel producing method, comprising the steps of:
   forming a laminated body by providing on an upper side of a supporting substrate in the following order:
   (i) a resin layer having tensile stress,
   (ii) an inorganic layer having mean stress of 0 (zero) or having tensile stress, a TFT layer in which inorganic insulating films that include a gate insulating film having compressive stress, a first interlayer insulating film having compressive stress, and a second interlayer insulating film having compressive stress are provided,
   (iii) an OLED element layer, and
   (iv) sealing layer in which a first sealing film that is an inorganic film having compressive stress, a second sealing film that is an organic insulating film having tensile stress, and a third sealing film that is an inorganic film having compressive stress are disposed in this order; and
   separating the supporting substrate from the laminated body; wherein
   in a plan view, an edge of at least one of the inorganic insulating films included in the TFT layer is located on an inner side of an edge of each of the first sealing film and the third sealing film included in the sealing layer.

2. The method as set forth in claim 1, wherein the inorganic layer includes a first inorganic film having tensile stress and a second inorganic film having compressive stress.

3. The method as set forth in claim 1, wherein the supporting substrate is removed after a top film having flexibility is bonded onto the sealing layer.

4. The method as set forth in claim 1, wherein the inorganic layer is formed so as to be in contact with the resin layer.

5. The method as set forth in claim 1, wherein a bottom film having flexibility is bonded to a lower side of the resin layer after the supporting substrate is separated.

6. The method as set forth in claim 2, wherein the second inorganic film is formed on an upper side of the first inorganic film.

7. The method as set forth in claim 2, wherein the first inorganic film is formed so as to be thicker than the second inorganic film.

8. The method as set forth in claim 2, wherein each of the first inorganic film and the second inorganic film is formed by a CVD method.

9. The method as set forth in claim 2, wherein the first inorganic film and the second inorganic film are made of respective different inorganic compounds.

10. The method as set forth in claim 2, wherein the first inorganic film is made of silicon oxynitride.

11. The method as set forth in claim 2, wherein the second inorganic film is made of silicon nitride or silicon oxide.

12. The method as set forth in claim 2, wherein the first inorganic film is caused to function as a stress adjusting film.

13. The method as set forth in claim 2, wherein the second inorganic film is caused to function as a barrier film.

14. The method as set forth in claim 2, wherein the inorganic layer includes a third inorganic film which functions as a base coat film of a semiconductor of the TFT layer.

15. The method as set forth in claim 1, wherein a terminal part is formed which includes the resin layer, the inorganic layer, and the TFT layer but does not include the OLED element layer and the sealing layer.

16. The method as set forth in claim 1, wherein the supporting substrate is separated by irradiating a lower surface of the supporting substrate, which is a light-transmitting substrate, with laser light.

17. The method as set forth in claim 1, wherein an absolute value of mean stress of the laminated body is not more than 10.0 Mpa before the supporting substrate is separated.

18. The method as set forth in claim 14, wherein the first inorganic film, the second inorganic film, and the third inorganic film are formed in order from a resin-layer side.

19. An OLED panel producing device which carries out the steps of the OLED panel producing method as set forth in claim 1.

* * * * *